(12) United States Patent
Chandrasekaran (10) Patent No.: US 7,998,809 B2
(45) Date of Patent: Aug. 16, 2011

(54) METHOD FOR FORMING A FLOATING GATE USING CHEMICAL MECHANICAL PLANARIZATION

(75) Inventor: Naga Chandrasekaran, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 11/433,384

(22) Filed: May 15, 2006

(65) Prior Publication Data

US 2007/0264777 A1 Nov. 15, 2007

(51) Int. Cl.
*H01L 21/336* (2006.01)

(52) U.S. Cl. ........ 438/257; 438/201; 438/211; 438/258; 438/259; 438/261; 257/E21.422; 257/E21.68; 257/E21.687; 257/E21.688

(58) Field of Classification Search .................... 438/257
See application file for complete search history.

(56) References Cited

U.S. PATENT DOCUMENTS

| | | | |
|---|---|---|---|
| 5,767,005 A | 6/1998 | Doan et al. | |
| 5,930,645 A * | 7/1999 | Lyons et al. | 438/424 |
| 6,013,551 A * | 1/2000 | Chen et al. | 438/264 |
| 6,258,692 B1 * | 7/2001 | Chu et al. | 438/400 |
| 6,337,255 B1 * | 1/2002 | Bradl et al. | 438/424 |
| 6,399,449 B1 * | 6/2002 | Matsumoto | 438/296 |
| 6,403,486 B1 * | 6/2002 | Lou | 438/694 |
| 6,417,047 B1 * | 7/2002 | Isobe | 438/258 |
| 6,530,968 B2 * | 3/2003 | Tsuchiya et al. | 51/307 |
| 6,559,028 B1 * | 5/2003 | Hause et al. | 438/424 |
| 6,649,965 B2 * | 11/2003 | Takada et al. | 257/314 |
| 6,743,676 B2 * | 6/2004 | Park et al. | 438/257 |
| 6,787,471 B2 * | 9/2004 | Kobayashi | 438/691 |
| 6,838,342 B1 * | 1/2005 | Ding | 438/257 |
| 6,864,150 B2 * | 3/2005 | Lin et al. | 438/424 |
| 6,872,632 B2 * | 3/2005 | Ibara | 438/427 |
| 6,943,075 B2 * | 9/2005 | Joo | 438/211 |
| 6,949,792 B2 | 9/2005 | Hurley et al. | |
| 7,056,804 B1 * | 6/2006 | Lyons et al. | 438/424 |
| 7,098,116 B2 * | 8/2006 | Lu et al. | 438/427 |
| 7,122,427 B2 * | 10/2006 | Jung et al. | 438/257 |
| 7,148,117 B2 * | 12/2006 | Seo | 438/389 |
| 7,186,627 B2 * | 3/2007 | Jin | 438/429 |
| 7,223,994 B2 * | 5/2007 | Chidambarrao et al. | 257/18 |
| 7,531,415 B2 * | 5/2009 | Kwok | 438/296 |
| 2001/0002055 A1 * | 5/2001 | Clampitt et al. | 257/315 |
| 2002/0042180 A1 * | 4/2002 | Tuan et al. | 438/257 |
| 2003/0119257 A1 * | 6/2003 | Dong et al. | 438/257 |
| 2003/0124800 A1 * | 7/2003 | Park et al. | 438/257 |
| 2003/0129839 A1 * | 7/2003 | Lee et al. | 438/694 |
| 2003/0139051 A1 * | 7/2003 | Andideh et al. | 438/692 |
| 2003/0199149 A1 * | 10/2003 | Lee et al. | 438/424 |
| 2003/0232494 A1 * | 12/2003 | Adams et al. | 438/622 |
| 2004/0097046 A1 * | 5/2004 | Maruyama et al. | 438/294 |
| 2004/0097080 A1 * | 5/2004 | Kim et al. | 438/689 |
| 2004/0157406 A1 * | 8/2004 | Ibara | 438/435 |
| 2004/0163324 A1 | 8/2004 | Lee et al. | |
| 2004/0203217 A1 * | 10/2004 | Lai et al. | 438/435 |
| 2004/0241949 A1 * | 12/2004 | Asakawa | 438/294 |

(Continued)

*Primary Examiner* — N Drew Richards
*Assistant Examiner* — Ankush K Singal
(74) *Attorney, Agent, or Firm* — Dickstein Shapiro LLP (57) ABSTRACT

An improved process forming a floating gate region of a semiconductor memory device. The process includes using a ceria slurry for chemical mechanical planarization to provide "stop on polysilicon" capabilities, allowing a thin nitride layer, or in the alternative no nitride layer, to be used and reducing the number of processing steps required to form the floating gate region.

36 Claims, 9 Drawing Sheets

U.S. PATENT DOCUMENTS

| | | | |
|---|---|---|---|
| 2005/0106813 A1* | 5/2005 | Lee et al. | 438/257 |
| 2005/0106822 A1* | 5/2005 | Lee et al. | 438/294 |
| 2005/0136673 A1* | 6/2005 | Xu et al. | 438/693 |
| 2005/0142804 A1* | 6/2005 | Shin | 438/424 |
| 2006/0088965 A1* | 4/2006 | Yang | 438/264 |
| 2006/0121725 A1* | 6/2006 | Basol et al. | 438/626 |
| 2006/0211215 A1* | 9/2006 | Yoshida | 438/424 |
| 2006/0211250 A1* | 9/2006 | Hou et al. | 438/692 |
| 2006/0216935 A1* | 9/2006 | Oswald et al. | 438/691 |
| 2007/0026632 A1* | 2/2007 | Yamamoto | 438/424 |
| 2007/0190715 A1* | 8/2007 | Ohta | 438/221 |
| 2008/0081411 A1* | 4/2008 | Cho et al. | 438/257 |
| 2008/0108219 A1* | 5/2008 | Huebinger et al. | 438/618 |

* cited by examiner

METHOD FOR FORMING A FLOATING GATE USING CHEMICAL MECHANICAL PLANARIZATION

FIELD OF THE INVENTION

The present invention relates to the field of semiconductor devices and, in particular, to a method for forming floating gate regions.

BACKGROUND OF THE INVENTION

A nonvolatile memory is a type of memory that retains stored data when power is removed. There are various types of nonvolatile memories including e.g., read only memories (ROMs), erasable programmable read only memories (EPROMs), and electrically erasable programmable read only memories (EEPROMs). One type of EEPROM device is a flash EEPROM device (also referred to as "flash memory").

Each nonvolatile memory device has its own unique characteristics. For example, the memory cells of an EPROM device are erased using an ultraviolet light, while the memory cells of an EEPROM device are erased using an electrical signal. In a conventional flash memory device blocks of memory cells are simultaneously erased (what has been described in the art as a "flash-erasure"). The memory cells in a ROM device, on the other hand, cannot be erased at all. EPROMs, and EEPROMs, including flash memory, are commonly used in computer systems that require reprogrammable nonvolatile memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include, e.g., portable computers, personal digital assistants (PDAs), digital cameras, portable music players, and cellular telephones. Program code, system data such as a basic input/output system (BIOS), and other firmware can typically be stored in flash memory devices.

FIGS. 1A-1G depict one conventional process of forming floating gate regions for one-transistor storage cells of non-volatile memory devices.

Figure 1A:
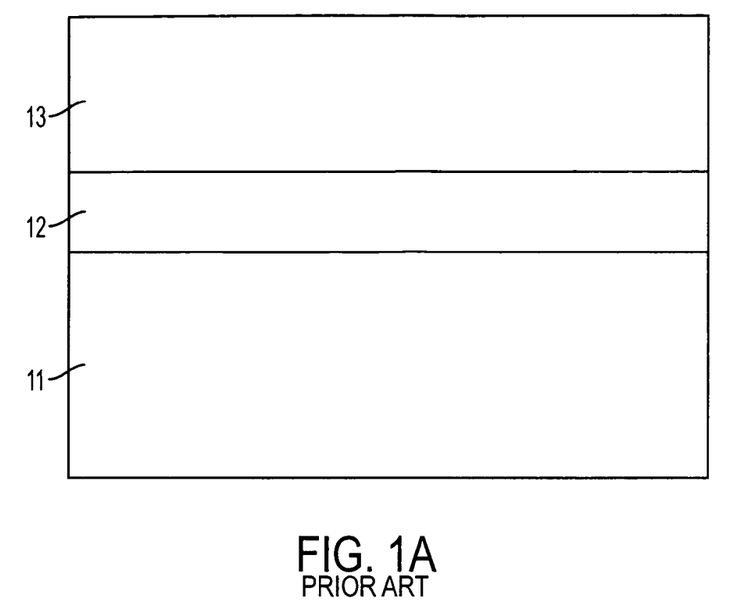
FIGS. 1A-1G illustrate a method of manufacturing a floating gate region of a non-volatile memory device according to the prior art.
Figure 1B:
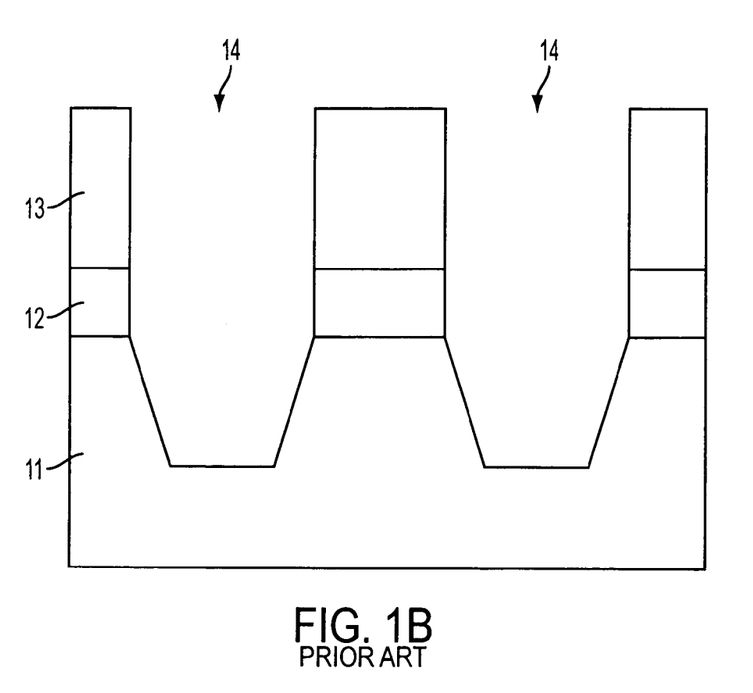
Figure 1C:
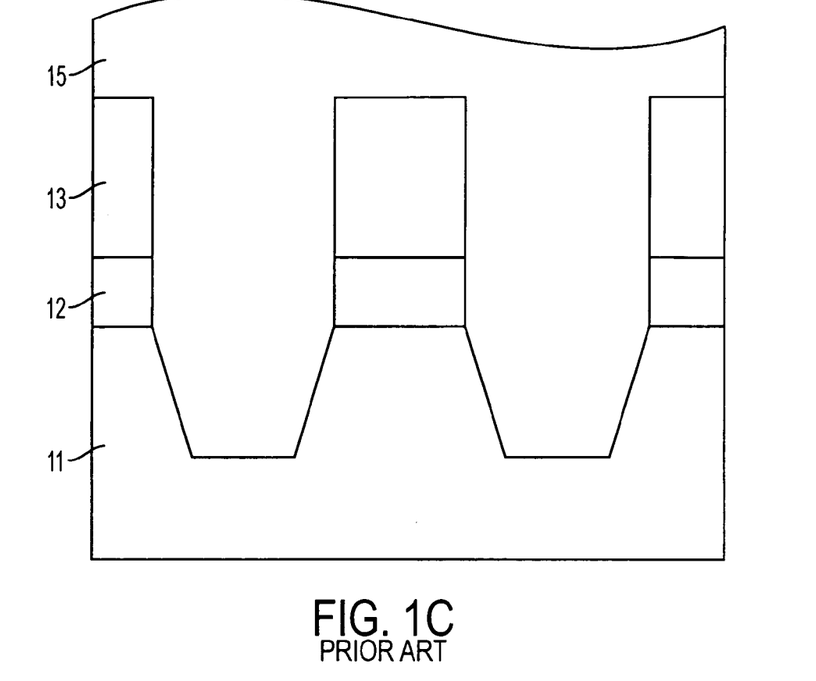

As shown in FIG. 1A, a pad oxide layer 12 is formed on a silicon substrate 11. A nitride layer 13 is then formed on top of the pad oxide 12. Trenches 14 are formed in the resulting structure, as shown in FIG. 1B. An oxide layer 15 is deposited within the trenches 14 and on top of the nitride layer 13. The resulting structure is shown in FIG. 1C.

Figure 1D:
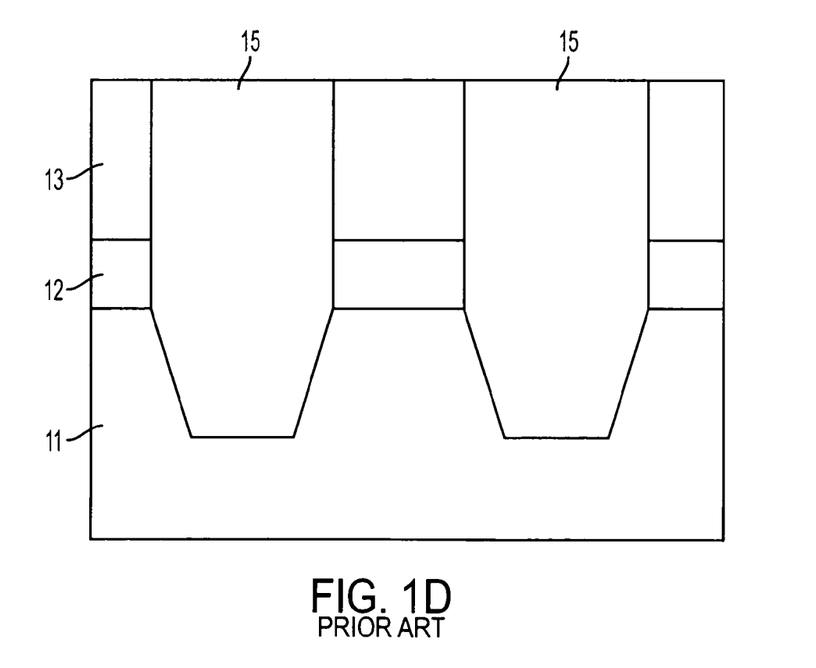
Figure 1E:
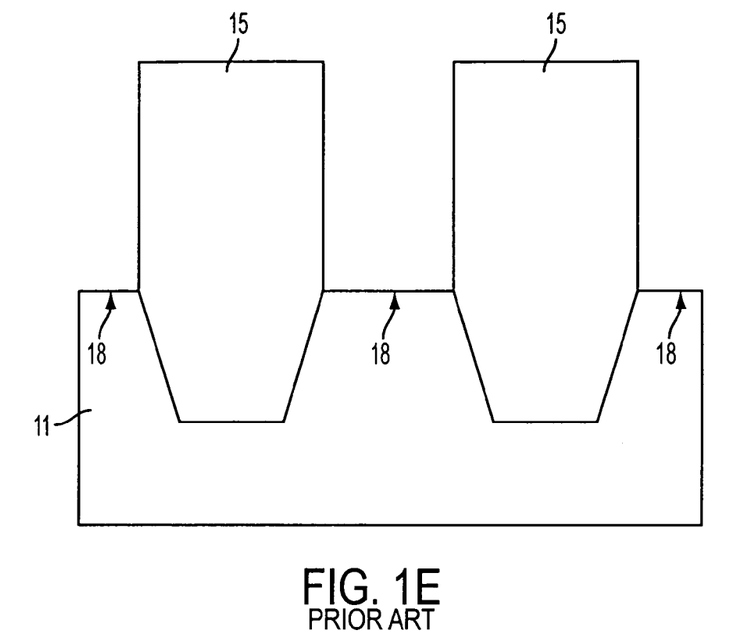

Standard STI chemical mechanical planarization (CMP) is used to isolate the active regions of the device. The conventional STI CMP process uses the nitride layer 13 as a stop layer. The structure resulting from the STI CMP process is illustrated in FIG. 1D. As shown in FIG. 1E, after the STI CMP process, the nitride layer 13 and the pad oxide layer 12 are stripped, thus exposing the active areas 18.

Figure 1F:
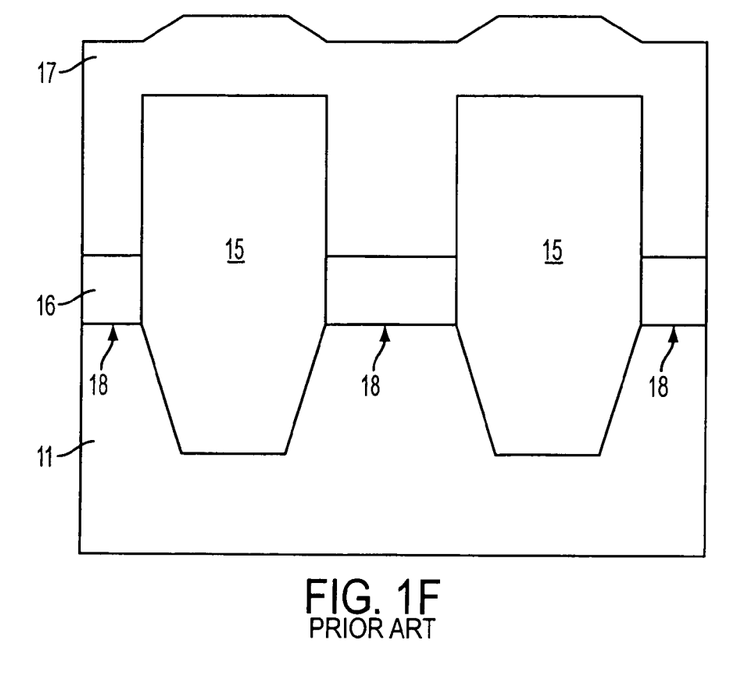
Figure 1G:
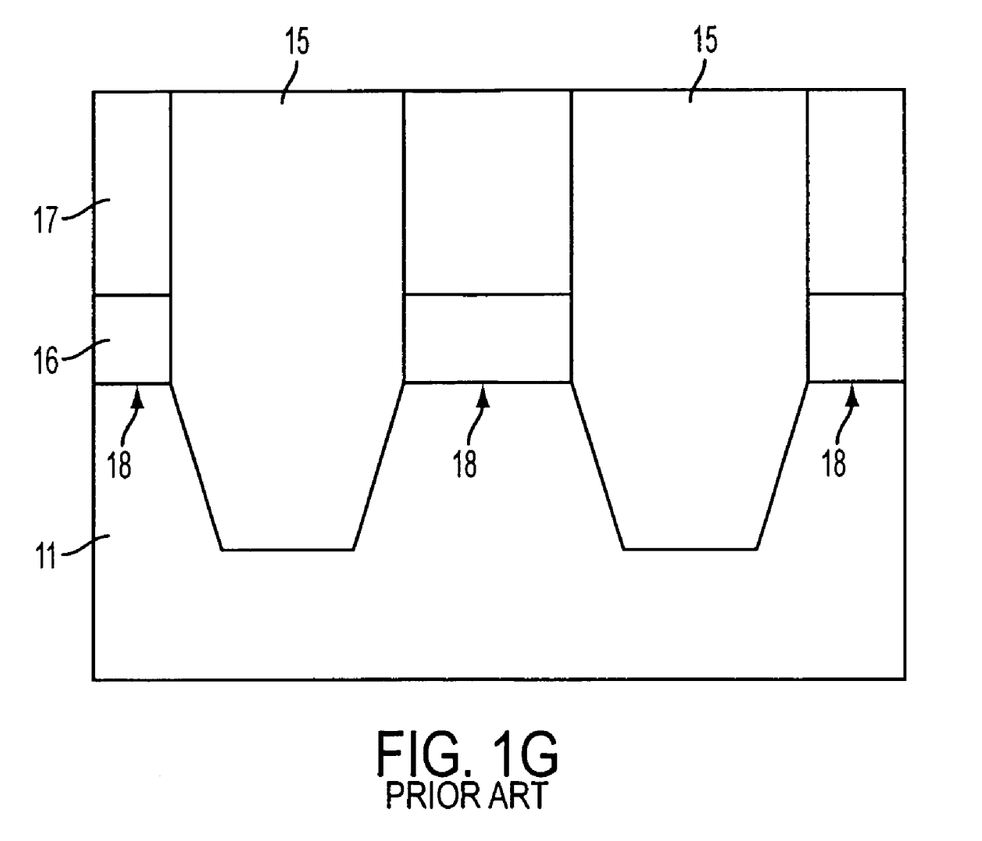

After the nitride layer 13 and pad oxide layer 12 are stripped, a gate oxide layer 16 and a polysilicon layer 17 are deposited (FIG. 1F). The polysilicon layer 17 will form the floating gate of completed one-transistor flash memory cells. As is shown in FIG. 1F, polysilicon 17 is deposited over the active areas and the oxide 15. A self aligned floating gate (SAFG) CMP process is then implemented to remove excess polysilicon 17 and to isolate the polysilicon 17 in the active areas 18.

The SAFG CMP process is very demanding. The amount of polysilicon 17 left behind over the active areas 18 depends on the field leveling in the array and periphery, oxide dishing in the periphery, array center to edge doming, and the amount of nitride remaining. Dishing refers to the thinning of a structure, caused by uneven polishing based on the selectivity of the slurry being used, resulting in a dish-like profile when measured in reference to the surrounding material. For example, when polishing oxide and stopping on nitride, the slurry used is typically selective to nitride, so when the polish hits nitride, it polishes oxide faster than nitride, resulting in a dish-like profile in the oxide at the level of the nitride. Doming is the opposite of dishing, resulting in a dome-like profile. Doming is usually caused by fill pattern issues. The SAFG CMP needs to be highly selective to the oxide 15 with good polysilicon 17 polishing rate; however, the CMP should not cause dishing in the polysilicon 17.

It is desirable to integrate the above described STI CMP and SAFG CMP steps into a single process flow to overcome the above-noted shortcomings. Accordingly, a simplified process for forming a floating gate region of the transistor storage cells of a non-volatile memory device is needed and desired.

BRIEF DESCRIPTION OF THE DRAWINGS

The above described features of the invention will be more clearly understood from the following detailed description, which is provided with reference to the accompanying drawings.

DETAILED DESCRIPTION OF THE INVENTION

The present invention provides a method of manufacturing non-volatile memory devices having memory cell transistors with floating gates.

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "substrate" is used in the following description to refer to any supporting layer suitable for fabricating an integrated circuit, typically semiconductor based, but not necessarily so. A substrate may be silicon-based, may include epitaxial layers of silicon supported by a base semiconductor or non-semiconductor foundation, can be sapphire-based, silicon-on-insulator (SOI), metal, polymer, or any other suitable materials. When reference is made to a substrate in the following description, previous process steps may have been utilized to form regions, junctions or other structures in or over a base semiconductor or other foundation.

Additionally, while exemplary embodiments of the invention are described in connection with flash memory, the invention is not so limited. The invention is applicable to other integrated circuit devices and systems, which might employ floating gate structures.

The invention relates to an improved method for forming a floating gate semiconductor device. The method uses an improved chemical mechanical planarization (CMP) process to form a self-aligned floating gate region, which requires less steps than the number of steps used in the prior art.

An first exemplary embodiment of the invention is described below in connection with FIGS. 2A-2D. A similar second exemplary embodiment is also described in connection with FIGS. 3A-3D. A third exemplary embodiment is described in connection with FIG. 4.

Figure 2A:
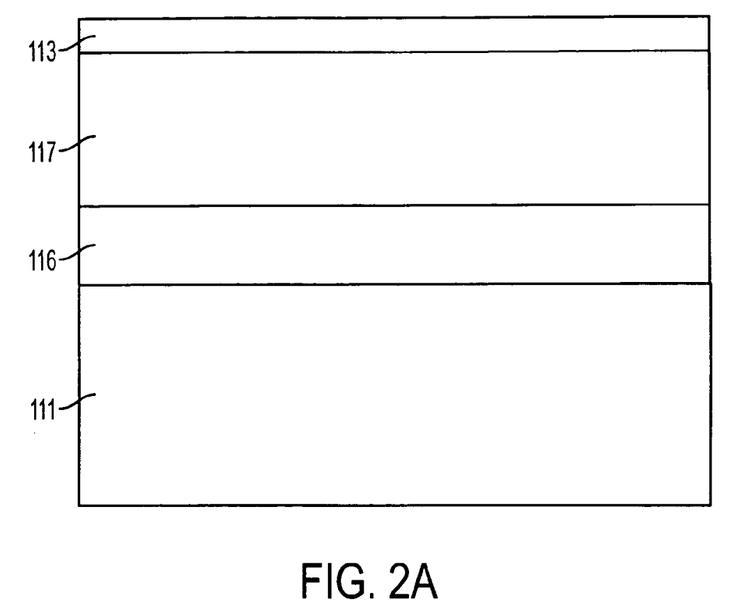
FIGS. 2A-2D illustrate a method of manufacturing a floating gate region of a non-volatile memory device according to a first exemplary embodiment of the invention.

As shown in FIG. 2A, a gate oxide layer 116 is formed over a silicon substrate 111. A thick polysilicon layer 117 is formed over the gate oxide layer 116. Next, a thin nitride layer 113 is formed over the polysilicon layer 117. The thickness of the nitride layer 113 may be in the range of about 50 Å to about 150 Å thick. The thin nitride layer 113 enables the thicker polysilicon layer 117 to be used. The thickness of the final polysilicon layer 117 (FIG. 2D) may be in the range of about 400 Å to about 1000 Å thick.

Figure 2B:
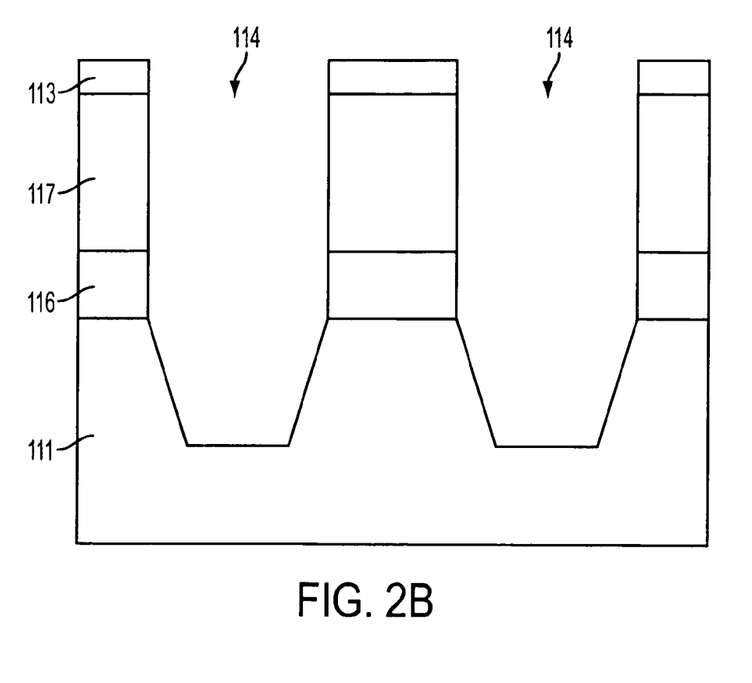
Figure 2C:
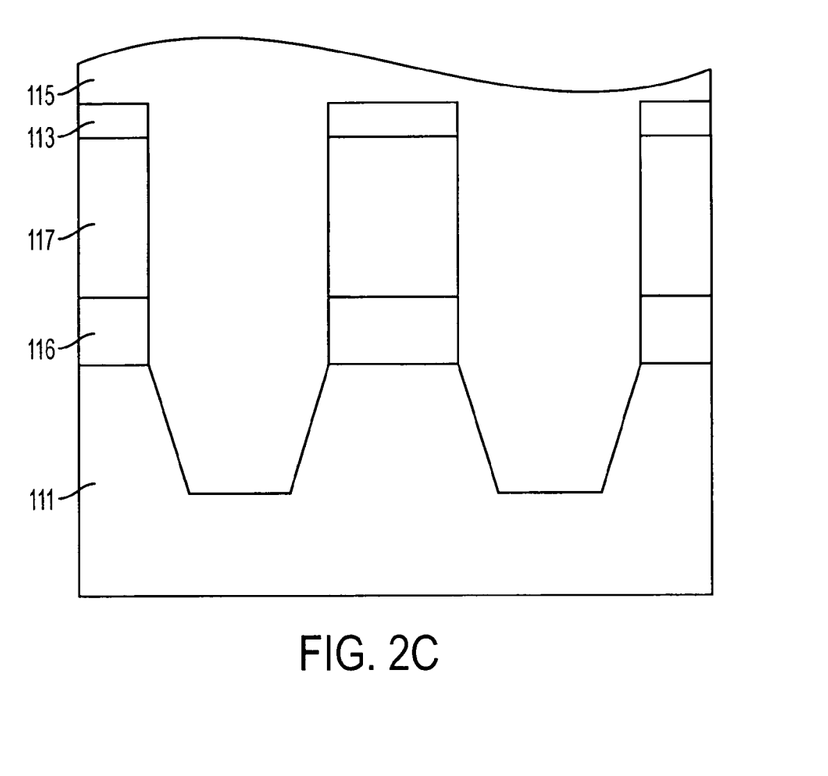

As shown in FIG. 2B, trenches 114 are formed in the resulting structure, by any process known in the art for forming shallow trench isolation (STI) regions. An oxide layer 115 is then deposited within the trenches 114 and on top of the nitride layer 113, as is shown in FIG. 2C. The oxide layer 115 may be formed of, for example, a high density plasma (HDP) oxide, O3-TEOS oxide, spin on dielectric (SOD), or any other suitable oxide known in the art.

Figure 2D:
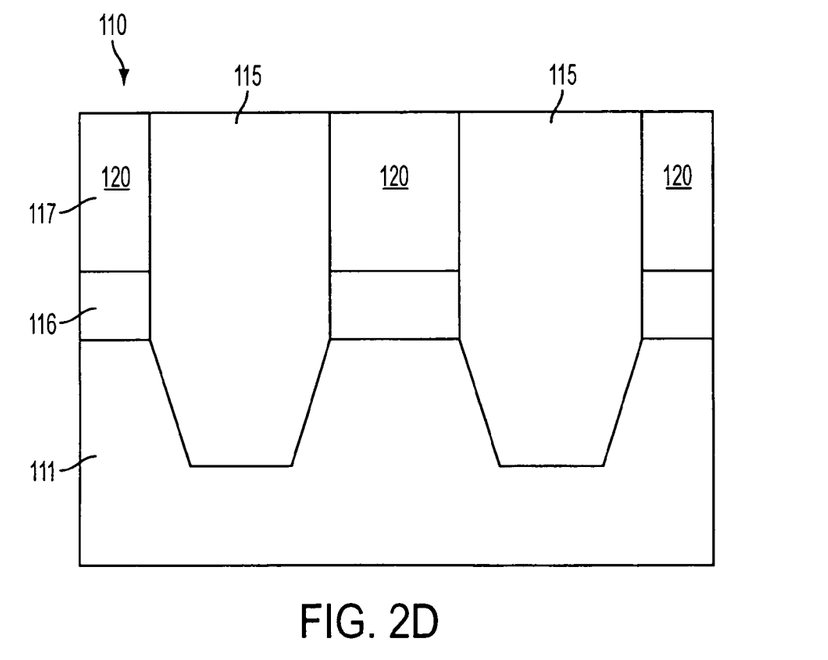
Figure 3A:
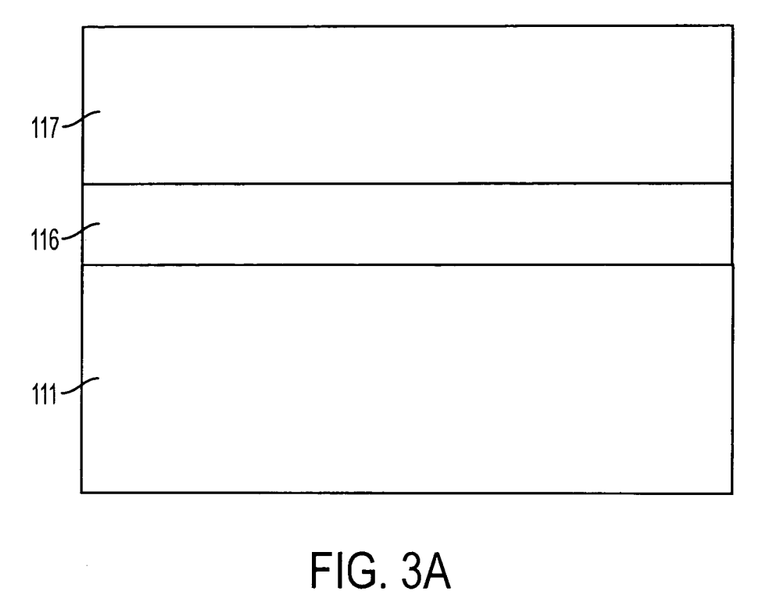
FIGS. 3A-3D illustrate a method of manufacturing a floating gate region of a non-volatile memory device according to a second exemplary embodiment of the invention.
Figure 3B:
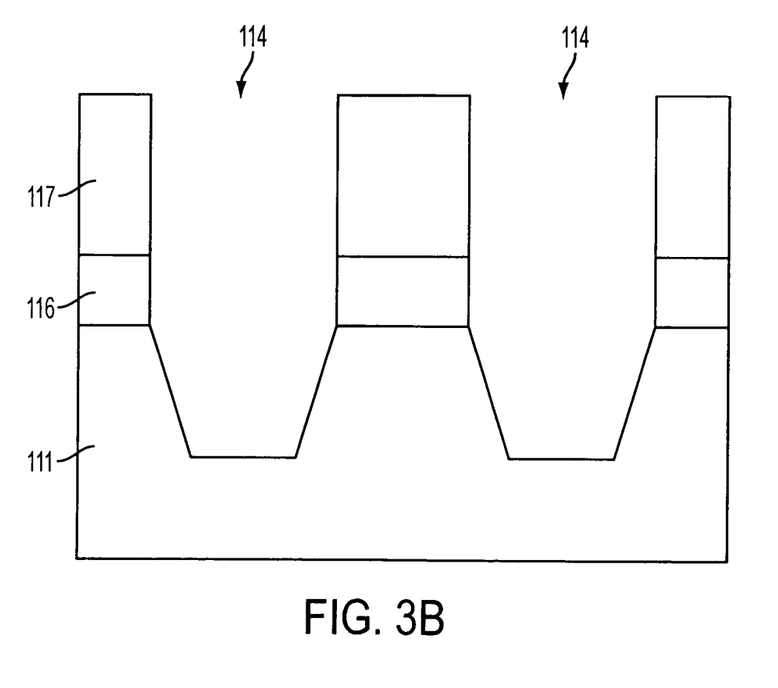
Figure 3C:
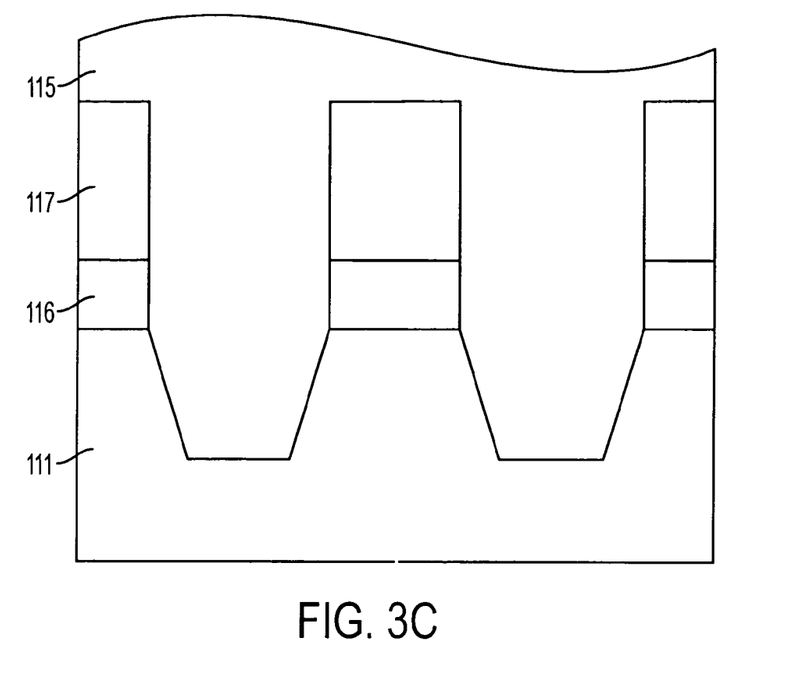

In a second exemplary embodiment of the invention, the nitride layer 113 may be eliminated, as shown in FIGS. 3A-D. In the case of the second embodiment, the oxide layer 115 is deposited directly on top of the polysilicon layer 117, as shown in FIG. 3C. Like reference numerals in FIGS. 3A-D refer to the same elements as in FIGS. 2A-D and are not discussed in detail herein.

Figure 3D:
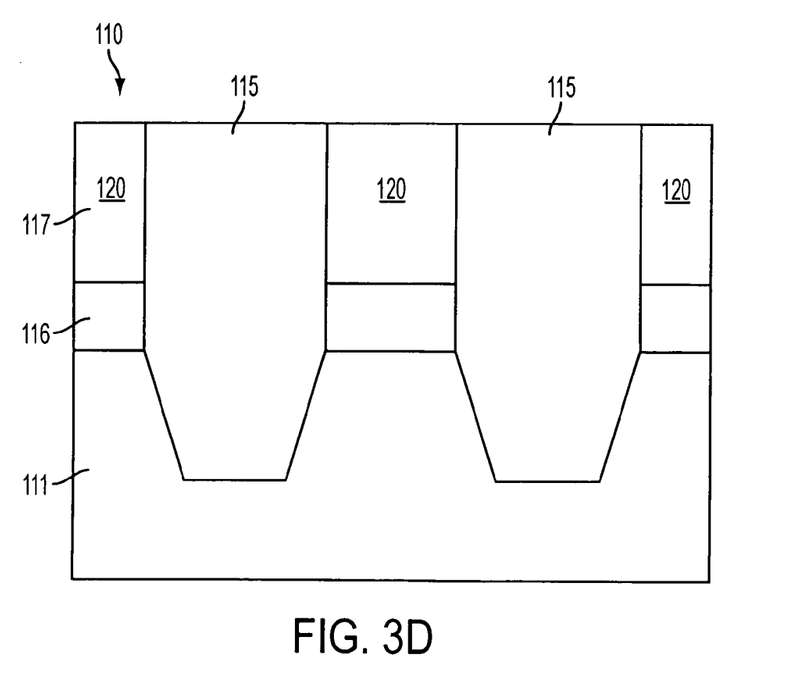

In both the first and second embodiments, chemical mechanical planarization (CMP) is performed during which the oxide layer 115 is partially removed and planarized. As the oxide 115 is being removed in the first embodiment, the CMP process will reach the nitride layer 113. The slurry used in the CMP process of the invention has the capability to remove nitride as well as the oxide. Thus, the thin nitride layer 113 of the first embodiment can be easily removed. As explained below, the selectivity of the slurry allows the process to stop on polysilicon layer 117. Thus, polysilicon layer 117 acts as the stop layer for the CMP process of the invention. In the second embodiment, the CMP process removes the oxide layer 115 and stops on the polysilicon layer 117, as well. The result is a desired thickness of polysilicon 117 in between the oxide areas 115. The resulting floating gate region 110 is shown in FIGS. 2D and 3D. The floating gates 120 are the remaining portions of polysilicon layer 117, insulated from each other by the oxide areas 115. As can be seen, this process requires fewer steps than the conventional process for forming floating gate regions.

An additional benefit of the process is that the slurry used provides enough over-polish margin to clear any oxide 115 and/or nitride 113 residuals. Moreover, polysilicon residue over "dished" oxide areas is also eliminated since there is no polysilicon deposited over the oxide areas during the process.

The STI CMP process of the present invention provides "stop on polysilicon" capability. The slurry used in the present invention is a ceria slurry. A ceria slurry is a slurry comprised of cerium oxide ($CeO_2$) particles. The ceria slurry of the invention includes $CeO_2$ particles which may have a mean particle size in the range of about 0.1 μm to about 1.5 μm. The ceria slurry has a solids percentage between about 1% and about 7%. Before use, the slurry is mixed with any cationic and/or any anionic additive. The solids percentage at the point of use may be between about 1% and about 4%. An example of an appropriate additive includes cationic cetyl trimethyl ammonium bromide (CTAB) additive. Post mixing of the slurry and additive should yield a pH range between about 5 and about 8. The ceria slurry with the additive, when mixed in the above specified ratios, provides the necessary oxide and nitride rate with selectivity and planarization capability along with good selectivity to polysilicon. Controlling the solids percentage, pH, and mix ratio can alter the selectivity between oxide, nitride, and polysilicon. Higher pH tends to increase polysilicon rate and decrease nitride rate, while higher solids percentage has a low impact on polysilicon rate but increases nitride rate significantly.

Figure 4:
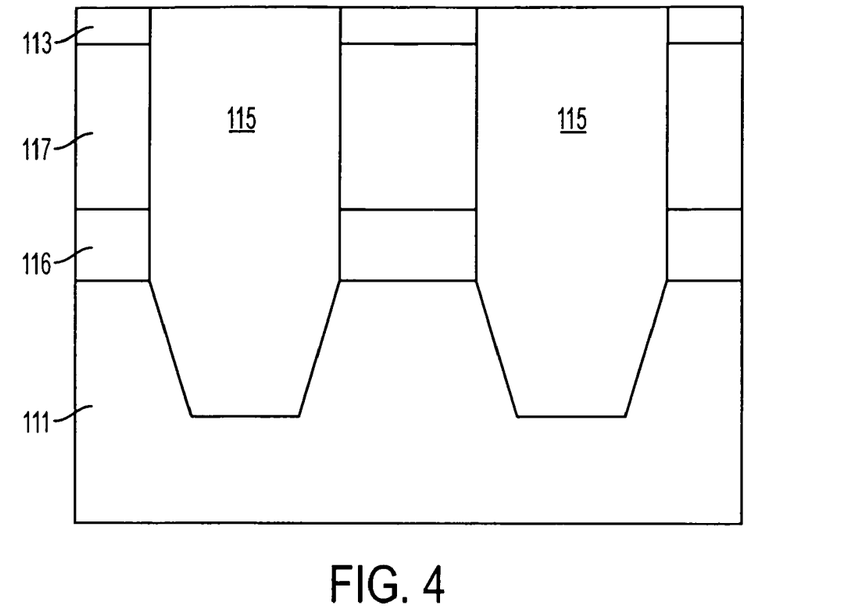
FIG. 4 illustrates an intermediate processing step of a third exemplary embodiment of the invention, which fits between the steps of FIGS. 2C and 2D.

In a third exemplary embodiment, the addition of the additives to the slurry may occur after the stop on nitride using traditional STI CMP is achieved. In this case, a standard STI slurry will be used to remove the oxide layer 115 and stop on nitride 113, as shown in FIG. 4. Beyond that point, a slurry of the invention formulated to have a 1:1:1 or 0.5:1:1 poly:nitride:oxide selectivity will be used to remove the nitride layer 113 and stop on polysilicon 117. This process requires an intermediate processing step between FIGS. 2C and 2D, illustrated in FIG. 4.

Figure 5:
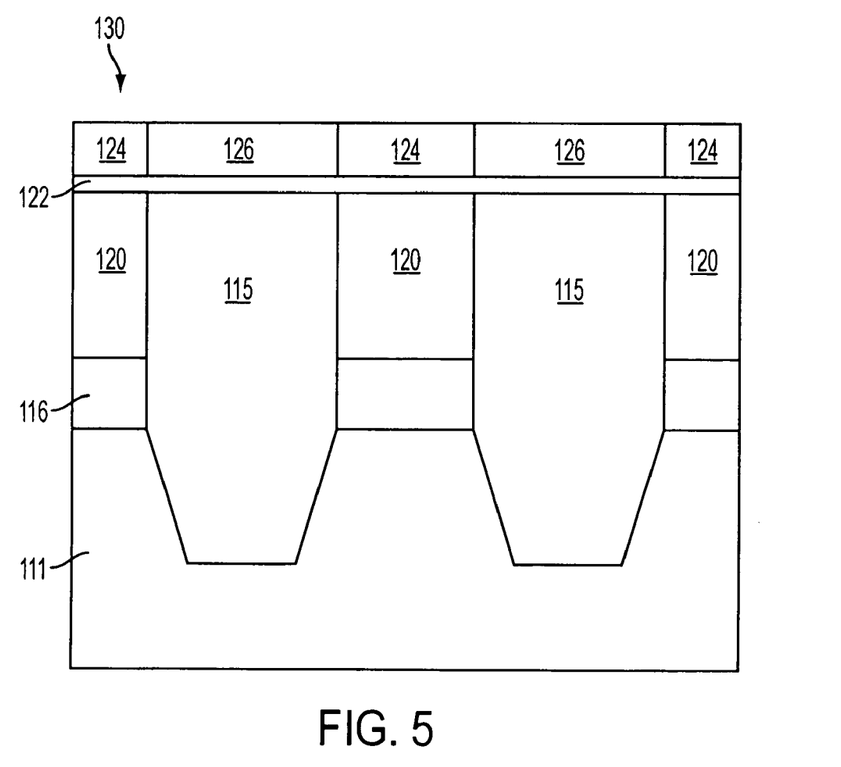
FIG. 5 illustrates a flash memory device including a floating gate region formed in accordance with the invention.

As shown in FIG. 5, the floating gate region formed in accordance with the invention may be included as part of a flash memory structure 130. The oxide 115 provides insulation between the floating gates 120. Oxide layer 122 is formed above the floating gates 120 and the oxide 115. Control gates 124 are formed above the floating gates 120 and the oxide layer 122. Oxide 126 provides insulation between the control gates 124. The control gates 124 and oxide 126 are formed as is known in the art.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. A method of forming a floating gate region comprising the acts of:
   providing a first insulating layer over a substrate;
   providing a conductive layer over the first insulating layer;
   forming a trench extending through the conductive layer and the first insulating layer and into the substrate;
   providing a second insulating layer over the conductive layer and within the trench; and planarizing the second insulating layer and any intermediate layers to remove all of the second insulating layer that is above the conductive layer, wherein the process used for planarization is a chemical mechanical planarization process that has characteristics which cause the planarization to stop when it reaches the conductive layer, wherein the floating gate region comprises a portion of the conductive layer which remains after the trench is formed and upon which the planarization stops, and wherein the second insulating layer within the trench forms an isolation region corresponding to the floating gate region.

2. The method of claim 1, further comprising providing a third insulating layer over the conductive layer, and wherein the trench extends through the third insulating layer.

3. The method of claim 1, wherein the first insulating layer comprises an oxide.

4. The method of claim 1, wherein the conductive layer comprises polysilicon.

5. The method of claim 1, wherein the second insulating layer comprises an oxide.

6. The method of claim 1, wherein the chemical mechanical planarization process utilizes a slurry chosen to selectively remove only the second insulating layer and any intermediate layers but not the conductive layer.

7. The method of claim 1, wherein the trench surrounds the floating gate region.

8. The method of claim 2, wherein the third insulating layer comprises nitride.

9. The method of claim 2, wherein the planarizing step comprises:
a first chemical mechanical planarization process utilizing a first slurry which removes the second insulating layer; and
a second chemical mechanical planarization process utilizing a second slurry comprising $CeO_2$ particles and an additive which removes the third insulating layer, wherein the second slurry is chosen to selectively remove the third insulating layer and not the conductive layer.

10. The method of claim 4, wherein the polysilicon layer has a thickness of approximately 400 Å to 1000 Å.

11. The method of claim 8, wherein the nitride layer has a thickness of approximately 50 Å to 150 Å.

12. The method of claim 6, wherein the chemical mechanical planarization process also removes a third insulating layer provided between the conductive layer and the second insulating layer.

13. The method of claim 6, wherein the slurry comprises $CeO_2$ particles.

14. The method of claim 6, wherein the slurry has a solids percent within a range of about 1% and about 7%.

15. The method of claim 6, wherein the slurry is mixed with an additive.

16. The method of claim 13, wherein the $CeO_2$ particles have a mean particle size of between approximately 0.1 μm and 1.5 μm.

17. The method of claim 14, wherein the slurry has a solids percent within a range of about 1% and about 4%.

18. The method of claim 15, wherein the additive is cationic.

19. The method of claim 15, wherein the additive is anionic.

20. The method of claim 15, wherein the additive is cetyl trimethyl ammonium bromide.

21. The method of claim 15, wherein the slurry has a pH within a range of about 5 and about 8.

22. A method of forming a plurality of floating gate regions comprising the acts of:
providing a first oxide layer over a substrate;
providing a polysilicon layer over the first oxide layer;
providing an insulating layer over the polysilicon layer;
forming a plurality of trenches extending through the insulating layer, the polysilicon layer, the first oxide layer and into the substrate;
providing a second oxide layer over the insulating layer and within the plurality of trenches; and
planarizing the second oxide layer and the insulating layer to remove all of the second oxide layer that is above the plurality of trenches and to remove the insulating layer, the process used for planarization having characteristics which cause the planarization to stop when it reaches the polysilicon layer,
wherein the floating gate regions comprises portions of the polysilicon layer which remain after the plurality of trenches is formed and upon which the planarization stops, and
wherein the plurality of floating gate regions are isolated from each other by the second oxide layer provided within the plurality of trenches.

23. The method of claim 22, wherein the insulating layer is a nitride layer.

24. The method of claim 22, wherein the polysilicon layer has a thickness of approximately 400 Å to 1000 Å.

25. The method of claim 22, wherein the planarizing step utilizes a chemical mechanical planarization process which utilizes a slurry chosen to selectively remove only the second oxide and insulating layers.

26. The method of claim 23, wherein the nitride layer has a thickness of approximately 50 Å to 150 Å.

27. The method of claim 25, wherein the slurry comprises $CeO_2$ particles.

28. The method of claim 25, wherein the slurry has a solids percent within a range of about 1% and about 7%.

29. The method of claim 25, wherein the slurry is mixed with an additive.

30. The method of claim 27, wherein the $CeO_2$ particles have a mean particle size of between approximately 0.1 μm and 1.5 μm.

31. The method of claim 29, wherein the additive is at least one of a cationic additive and an anionic additive.

32. The method of claim 29, wherein the additive is cetyl trimethyl ammonium bromide.

33. The method of claim 29, wherein the slurry has a pH within a range of about 5 and about 8.

34. A method of forming a floating gate region comprising the acts of:
providing a first insulating layer over a substrate;
providing a conductive layer over the first insulating layer;
providing a second insulating layer over the conductive layer, wherein the second insulating layer comprises nitride and is formed directly on and contiguous with a top surface of the conductive layer;
forming a trench extending through the second insulating layer, the conductive layer and the first insulating layer and into the substrate, the trench being formed to create at least one isolated portion of the conductive layer;
providing a third insulating layer over the conductive layer and within the trench; and
removing the third insulating layer that is over the trench and removing the second insulating layer, wherein removing both the second and third insulating layers is accomplished by planarization which stops at the conductive layer, wherein the floating gate region comprises the isolated portion of the conductive layer which remains after the trench is formed and upon which the planarization stops.

35. A method of forming a floating gate region comprising the acts of:

provibing a first insulating layer over a substrate;

providing a conductive layer over the first insulating layer;

forming a trench extending through the conductive layer and the first insulating layer and into the substrate, the trench being formed to create an isolated portion of the conductive layer;

providing a second insulating layer directly on and contiguous with a top surface of the conductive layer and within the trench; and planarizing all of the second insulating layer that is above the conductive layer, wherein the planarization stops at the conductive layer, wherein the floating gate region comprises the isolated portion of the conductive layer which remains after the trench is formed and upon which the planarization stops.

36. A method of forming a floating gate region comprising the acts of providing a first insulating layer over a substrate;

providing a conductive layer over the first insulating layer;

forming a trench extending through the conductive layer and the first insulating layer and into the substrate;

providing a second insulating layer over the conductive layer and within the trench;

planarizing the second insulating layer and any intermediate layers to remove all of the second insulating layer that is above the conductive layer, wherein the planarization stops at the conductive layer, subsequent to the act of planarizing the second insulating layer and any intermediate layers, providing a third insulating layer over exposed portions of the second insulating layer and conductive layer; and providing a control gate over the third insulating layer, wherein planarizing the second insulating layer and any intermediate layers isolates the floating gate region which comprises a remaining portion of the conductive layer.

* * * * *

UNITED STATES PATENT AND TRADEMARK OFFICE
CERTIFICATE OF CORRECTION

| | | |
|---|---|---|
| PATENT NO. | : 7,998,809 B2 | Page 1 of 1 |
| APPLICATION NO. | : 11/433384 | |
| DATED | : August 16, 2011 | |
| INVENTOR(S) | : Naga Chandrasekaran | |

It is certified that error appears in the above-identified patent and that said Letters Patent is hereby corrected as shown below:

In column 8, line 2, in Claim 36, delete "of" and insert -- of: --, therefor.

Signed and Sealed this
Eighteenth Day of October, 2011

David J. Kappos
*Director of the United States Patent and Trademark Office*